(12) United States Patent
Huie

(10) Patent No.: US 7,554,352 B2
(45) Date of Patent: Jun. 30, 2009

(54) METHOD FOR DETERMINING INFORMATION ABOUT THE INTERNAL WORKINGS OF A CHIP BASED ON ELECTRO-MAGNETIC EMISSIONS THEREFROM

(75) Inventor: John Huie, Scottsdale, AZ (US)

(73) Assignee: VNS Portfolio LLC, Cupertino, CA (US)

( * ) Notice: Subject to any disclaimer, the term of this patent is extended or adjusted under 35 U.S.C. 154(b) by 40 days.

(21) Appl. No.: 11/592,717

(22) Filed: Nov. 3, 2006

(65) Prior Publication Data

US 2007/0120571 A1     May 31, 2007

Related U.S. Application Data

(60) Provisional application No. 60/733,397, filed on Nov. 4, 2005.

(51) Int. Cl.
*G01R 31/311*     (2006.01)
(52) U.S. Cl. .................. 324/765; 324/750; 324/512
(58) Field of Classification Search .................. None
See application file for complete search history.

(56) References Cited

U.S. PATENT DOCUMENTS 5,300,879 A * 4/1994 Masuda et al. ............. 324/95
5,714,888 A * 2/1998 Naujoks .................... 324/750
6,281,697 B1 * 8/2001 Masuda et al. ............. 324/765

* cited by examiner

*Primary Examiner*—Vinh P Nguyen
(74) *Attorney, Agent, or Firm*—Henneman & Associates, PLC; Larry E. Henneman, Jr.

(57) ABSTRACT

A novel a method for determining the internal operation of an integrated circuit (IC) includes measuring electromagnetic (EM) emissions from the integrated circuit chip and analyzing the EM emissions. In a particular method, the EM emissions from the IC are measured using an RF close end probe. In a particular method, the electromagnetic emissions are measured with the IC configured in various ways. In the normal operating mode, the emissions are measured while the IC is provided with power and any external clock signal(s). After measuring the emissions of the IC in normal operating mode, the IC is reconfigured by disabling the external clock signal(s) to the IC and remeasuring the emissions. The external clock signal is disabled by disconnecting the power to the IC, disabling the external clock signal, and then reconnecting power to the IC. In yet a third test mode, the external clock signal is reenabled while power continues to be supplied to the IC. Information about the presence and/or proper functioning of internal clocks of the IC can be determined by analyzing the spectral scan data obtained in one or more of the three test modes.

93 Claims, 11 Drawing Sheets

METHOD FOR DETERMINING INFORMATION ABOUT THE INTERNAL WORKINGS OF A CHIP BASED ON ELECTRO-MAGNETIC EMISSIONS THEREFROM

RELATED APPLICATIONS

This application claims the benefit of U.S. Provisional Patent Application Ser. No. 60/733,397 entitled "Method for Determining Information About the Internal Workings of a Chip Based on Electro-Magnetic Emissions Therefrom," filed Nov. 4, 2005 by the same inventor, which is incorporated herein by reference in its entirety.

BACKGROUND OF THE INVENTION

1. Field of the Invention

This invention relates generally to integrated circuits, and more particularly to techniques used to determine the internal workings of an integrated circuit through analysis electromagnetic emissions.

2. Description of the Background Art

Integrated circuits (IC) are miniaturized electronic circuits consisting mainly of semiconductors and passive devices. Due to their relatively small size, high performance, and low cost, ICs have become quite common in almost every electronic device manufactured today. In most instances, ICs range in size from only a few square millimeters up to around 250 square millimeters. While this small size is great for packaging within electronic devices, it often makes troubleshooting and quality control very difficult.

The testing of ICs is typically done at least twice during the manufacturing process; once at the wafer stage, and once as the individual ICs are packaged in an electronic device. Automated test equipment (ATE) such as wafer probes are the most common means for testing ICs. A wafer prober uses a probe card as an interface between the electronic test equipment and an IC. The problem with wafer probing is that it requires highly sophisticated and expensive test equipment, and it is very time consuming. Additionally, the equipment must also be calibrated such that it does not damage the IC during testing.

In order to reduce the time and costs associated with IC testing, ICs are often designed with testability features. The problem with testing only the testability features is that it is often difficult to determine if the IC is indeed operating properly by only testing a select few features. This type of testing more typically filters functional devices from non-functional devices.

One of the largest obstacles in IC testing is the testing of clock signals. Integrated circuits often include one or more clock signals for coordinating the actions of two or more circuits. These clock signals oscillate between a high and low state at a predetermined clock rate (cycles per second, as measured in Hertz). The clock signal(s) are used to synchronize different parts of the circuit, and also to account for delays in transmission. As ICs become more complex, a particular IC may have many clock signals present, with various different clock rates. It is often difficult to determine if the clock rates are operating properly via known test procedures.

As may be appreciated, if a clock signal is operational, but is either inaccurate or not properly synchronized, certain functions or calculations may not be performed correctly by the IC, resulting in a functional, yet defective device. Such devices are often difficult to diagnose or identify through known test procedures.

Additionally, often times manufacturers may find it necessary to reverse engineer products. Whether it be their own ICs, competitor's ICs, or vendor's ICs, reverse engineering is a useful tool in designing, diagnosing, and improving IC's. This practice up until now has included much of the previously described IC testing procedures, as well as some dissection type procedures. The problem has been that in addition to the expensive test equipment required, the process is typically destructive, and may require multiple trained professionals to decipher functions from parts. Indeed, this destructive type reverse engineering may be particularly troublesome if there is only one sample to work with.

What is needed, therefore, is a non-destructive system and method for testing the operation of internal clocks of integrated circuits.

SUMMARY

The present invention overcomes the problems associated with the prior art by providing a non-destructive system and method for testing internal clocks of integrated circuits by measuring electromagnetic emissions. The invention facilitates easier identification of faulty ICs by providing a non-destructive means for testing and identifying clock signals, as well as aiding in the reverse engineering of a particular IC through spectrum analysis.

According to one aspect of the present invention, a method for determining the internal operation of an integrated circuit (IC) includes measuring electromagnetic (EM) emissions from the integrated circuit chip and analyzing the EM emissions. In a particular method, the EM emissions from the IC are measured using an RF close end probe. The measurements can be taken over several different locations with respect to the IC.

In a particular method, the electromagnetic emissions are measured with the IC configured in various ways. In the normal operating mode, the emissions are measured while the IC is provided with power and any external clock signal(s). After measuring the emissions of the IC in normal operating mode, the IC is reconfigured by disabling the external clock signal(s) to the IC and remeasuring the emissions. The external clock signal is disabled by disconnecting the power to the IC, disabling the external clock signal, and then reconnecting power to the IC. In yet a third test mode, the external clock signal is reenabled while power continues to be supplied to the IC.

Various methods for analyzing the EM emissions are also disclosed. According to one method, the EM emissions are analyzed to determine whether they are below a predetermined radio frequency interference (RFI) level. According to another particular method, the EM radiation is measured over a range of frequencies, and the step of analyzing the EM emissions includes identifying frequencies corresponding to amplitudes greater than a predetermined amplitude (e.g., identifying frequency peaks in the spectrum). The identified frequencies can then be compared to a predetermined set of frequencies to determine whether the clock(s) of the IC are operating properly. In an alternative analysis, the identified frequencies are compared to sets of frequencies associated with known devices to determine whether any of the known devices are embedded in the IC. In yet another alternate analysis, the identified frequencies from the emissions of the IC in one test mode can be compared with the emissions of the same IC in another test mode to determine whether any internal clocks are synching with an internal clock or with the external clock signal.

The methods of the present invention can be implemented with an electronically readable medium having code embodied therein for causing an electronic device to perform and or facilitate any of the methods of the present invention.

An apparatus for determining the internal operation of an IC is also described. One embodiment of the apparatus includes a probe, a spectrum capture device, and a spectrum analyzer. The probe senses EM radiation from the IC. The spectrum capture device is operative to convert EM radiation sensed by the probe into electronic data. The spectrum analyzer is operative process the electronic data to provide information about the internal operation of the IC.

In one embodiment, the apparatus includes a display. The spectrum analyzer displays the captured spectrum data on the display in, for example, an amplitude versus frequency graph. In this embodiment, the data can be interpreted directly by the user simply by viewing the data on the display.

Another embodiment includes a processing unit for executing code and processing data, and memory for storing the data and code. The code includes a spectrum capture routine and a spectrum analyzer routine. The spectrum capture routine captures the electronic spectrum data and stores the data as records indicative of an EM spectrum emitted by the IC. Optionally, the spectrum capture routine can control the position of the probe and/or the configuration of the IC being tested. For example, the spectrum capture device can selectively interrupt the electrical power to the IC and/or selectively enable/disable the external clock signal.

The spectrum analyzer routine is operative to analyze the spectrum data captured by the spectrum capture routine. For example, the spectrum analyzer can compare sets of spectrum data captured from an IC during different test modes to ascertain relevant differences in the spectrum data. As another example, the spectrum analyzer can compare the captured spectrum data to spectrum data indicative of the proper operation of an internal clock of a known device to determine if the IC is operating properly. As yet another example, the spectrum analyzer can compare the captured data with sets of data associated with known electronic devices to determine whether any of the known devices are embedded in the IC.

Novel data structures are also disclosed.

BRIEF DESCRIPTION OF THE DRAWINGS

The present invention is described with reference to the following drawings, wherein like reference numbers denote substantially similar elements.

DETAILED DESCRIPTION

The present invention overcomes the problems associated with the prior art, by providing a system and method for the non-destructive testing of clock signals of integrated circuits. In the following description, numerous specific details are set forth (e.g., example testing methods) in order to provide a thorough understanding of the invention. Those skilled in the art will recognize, however, that the invention may be practiced apart from these specific details. In other instances, details of well known circuit testing practices (e.g., circuit connections, testing equipment, etc.) have been omitted, so as not to unnecessarily obscure the present invention.

Figure 1:
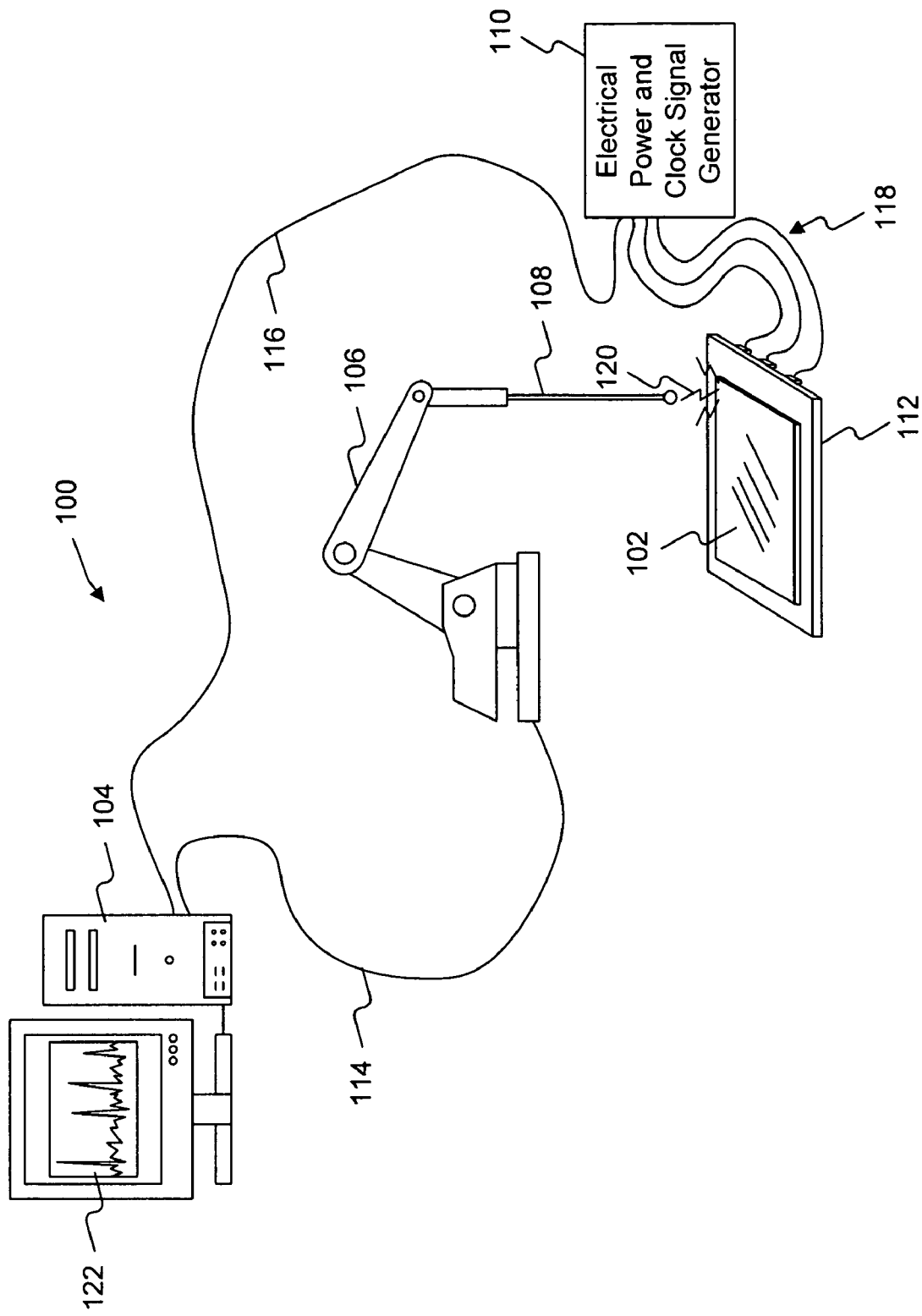
FIG. 1 illustrates an apparatus for testing integrated circuits according to one embodiment of the present invention.

FIG. 1 shows an apparatus 100 for testing an integrated circuit (IC) 102 according to one embodiment of the present invention. Testing apparatus 100 includes a general purpose computer system 104, a robotic arm 106, an electromagnetic emission sensing probe 108, a power and clock signal generator 110, and an IC interface 112. Robotic arm 106 is electrically coupled to and controlled by computer system 104 via cable 114, and power and signal generator 110 is coupled to and controlled by computer system 104 via cable 116. Cables 114 and 116 are representative of any type of communication cable, including but not limited to a USB cable, a firewire cable, an ethernet cable, and so on. Robotic arm 106, under the control of computer system 104, positions probe 108 during the measurement of EM emissions from IC 102. Power and clock signal generator 110 provides electrical power and clock signals, via electrical connections 118 and interface 112, to IC 102 to place IC 102 into several different test modes.

In one test mode, power and clock signal generator 110 provides IC 102 with power and an external clock signal, such that IC 102 operates in a normal mode of operation. During normal operation internal clocks (not visible) in integrated circuit 102 will emit electromagnetic (EM) radiation 120. EM emissions 120 are sensed by probe 108 as robotic arm 106 moves probe 108 over integrated circuit 102. EM emissions 120 sensed by probe 108 are converted to electrical signals and transmitted to computer system 104 via cable 114, where the electrical signals are analyzed to discern information regarding the presence and/or operation of clocks in IC 102. The electrical signals can be processed by software running on computer 104 and or displayed graphically on a display 122 of computer 104. The particular testing procedures will vary based on the purpose of the testing, and further details of the equipment and specific test procedures will be outlined in later figures.

In a particular embodiment, probe 108 is a radio frequency close end probe with a bandwidth of 30 Mhz to 1 Ghz or DC to 30 Mhz connected via an external 25 db gain amplifier (not shown) into a spectrum analyzer (in computer 104) with a bandwidth capability of DC to 7 Ghz. By using a close end type probe 108, emissions may be localized to the tip of probe 108, thereby eliminating the need to use an external screen room in order to localize the emissions leakage to the system component without having exterior emissions compromising the results.

Figure 2:
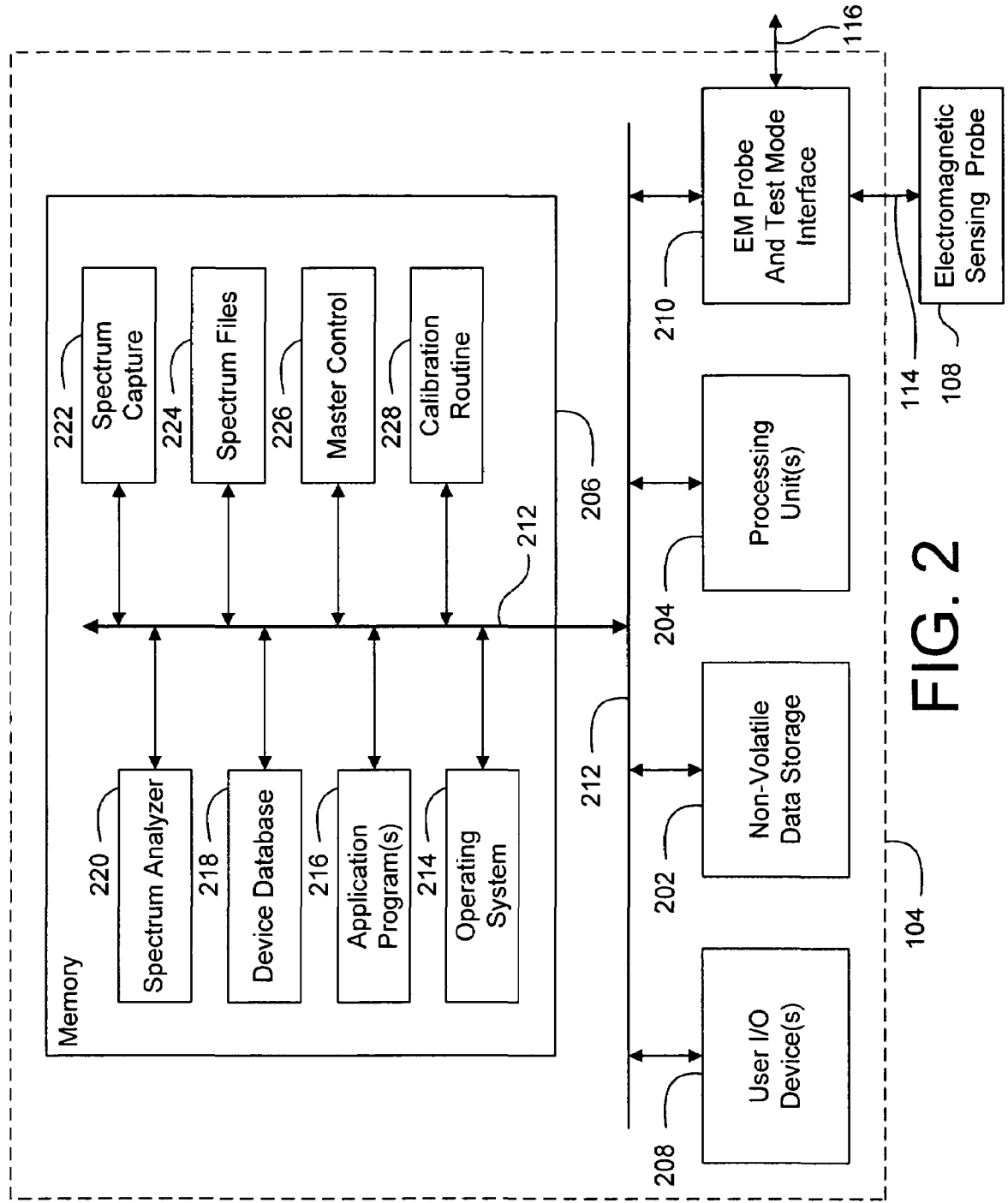
FIG. 2 is a block diagram showing the computer system of FIG. 1 in greater detail.

FIG. 2 is a block diagram showing computer system 104 in greater detail. Computer system 104 includes non-volatile data storage 202, one or more processing units 204, working memory 206, user I/O devices 208, and EM probe and test mode interface 210, all intercommunicating via an internal bus 212. Non-volatile data storage 202 stores data and code that are retained even when computer system 104 is powered down. Typical examples of non-volatile data storage include read only memory (ROM), hard disk drives, optical disk drives, and other types of removable media. Processing unit(s) 204 impart functionality to computer system 104 by processing executable code stored in non-volatile data storage 202 and memory 206. Working memory 206 provides temporary storage for data and code being processed by processing unit(s) 204. User I/O devices 208 provide a means for the user to interact with computer system 104, and typically include such devices as a keyboard, display 122, a printer, a pointing device, and so on. EM probe interface 210 is an interface that converts EM emissions received by electromagnetic sensing probe 108 into digital data that can be processed (e.g., displayed, stored, analyzed, etc.) by computer system 104.

In order to clearly explain the operation of testing apparatus 100, the functionality of computer system 104 is shown representationally as code blocks in memory 206. Those skilled in the art will understand, however, that all of the code need not remain in memory 206 during the operation of computer system 104. Indeed, processing unit(s) 204 will typically shuffle portions of the code into and out of memory 206 (e.g. to/from non-volatile data storage 202, etc.), for execution as required during operation. Further, although the functional blocks in memory 206 are shown to be physically coupled, those skilled in the art will understand that they are actually processes that communicate by calling one another for execution.

As shown in FIG. 2, memory 206 includes an operating system 214, one or more application programs 216, a device database 218, a spectrum analyzer 220, a spectrum capture routine 222, spectrum files 224, a master control routine 226, and calibration routine 228. Operating system 214 is a low level program upon which the other programs run. Application program(s) 216 is representative of word processing programs, graphics programs, and the like, and is intended to show that computer system 104 is a general purpose computer system that can host other applications that can enhance or augment the operation of computer 104 within testing apparatus 100.

Device database 218 is a database including records of manufacturers' specifications or empirically determined data for various integrated circuits. The records of device database 218 are used in the analysis of test data as a means for comparison, in determining the proper operation of known devices or the identification of unknown devices. Spectrum capture routine 222 is a program for initializing and terminating a test and controls the collection of EM emission data via EM probe and test mode interface 210. Spectrum analyzer 220 is a program that analyzes the collected spectrum data to provide information (e.g., existence and or proper operation of internal clocks, identification of unknown device, etc.) about the device being tested. Spectrum files 224 are files that store the data collected during a test scan and associate that data with the device tested. Spectrum files 224 can include, without limitations, data such as clock frequencies, clock circuit locations, chip architecture, and so on. Additionally, spectrum files 224 can be compared with device database 218 records to identify unknown devices, demonstrate the existence of an embedded processor, and so on. Master control 226 provides overall coordination and control of the testing features of computer 104 and, in particular, synchronizes the operations of robotic arm 106 and power and clock signal generator 110 with spectrum capture routine 222. In addition, master control 226 provides data to and receives commands from a user via user I/O devices 208. In general, master control 226 invoke the various other components of memory 206 in order to properly synchronize data collection, data display, data storage, data analysis, and so on throughout the testing procedure. Calibration routine 228 includes routines for calibrating EM sensing probe and amplifiers included in EM probe and test mode interface 210.

It should be noted that the function and data groupings within memory 206 may vary without departing from the scope of the present invention. These example functional and data groupings should not be limitations or essential elements of the invention. Rather, they are provided as an illustration of one particular mode of implementing the present invention, as well as to provide a more thorough understanding of the invention.

Figure 3:
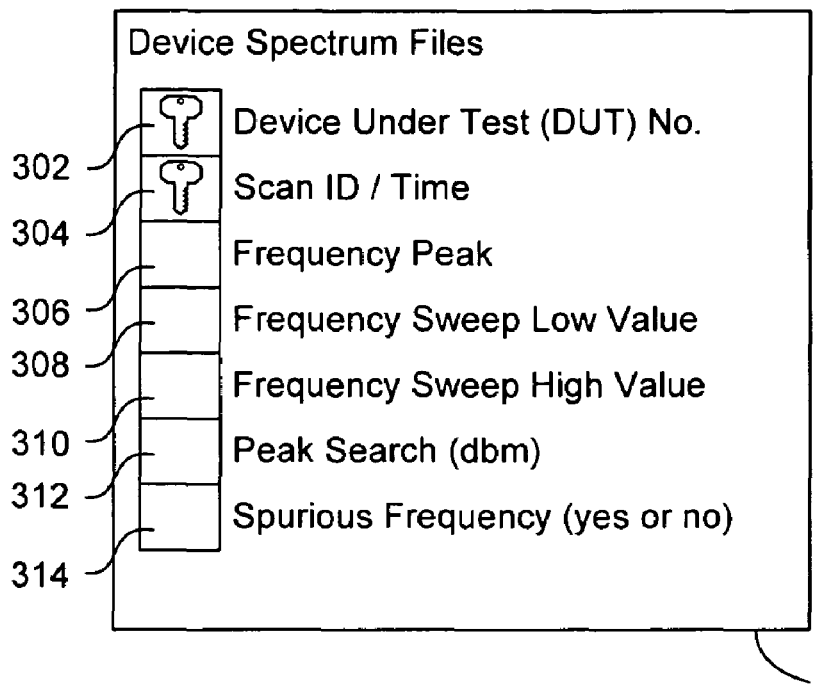
FIG. 3 is a diagram showing an example data structure for device EM spectrum data.

FIG. 3 is a database table 300 illustrating one example of a data structure that is suitable for use for spectrum files 224 of FIG. 2. The records of table 300 includes a DUT No. field 302, a Scan ID field 304, a Frequency Peak field 306, a Frequency Sweep Low Value field 308, a Frequency Sweep High Value field 310, a Peak Search field 312, and a Spurious Frequency field 314. DUT No. field 302 includes data indicative of a particular device under test. Scan ID field 304 includes data indicative of a particular scan (e.g., date and time). Frequency Peak field 306 includes data indicative of a particular frequency of EM radiation that exceeded a predetermined amplitude during the test scan, so as to be considered a frequency peak. Frequency Sweep Low Value field 308 includes data indicative of the lowest frequency measured during the scan. Frequency Sweep High Value field 310 includes data indicative of the highest frequency measured during the scan. Peak Search field 312 includes data indicative of the predetermined amplitude used to define a frequency peak. Finally, Spurious Frequency field 314 includes data indicative of whether or not the peak associated with the record appears to be just a spurious peak or the result of a clock operating on IC 102.

Figure 4:
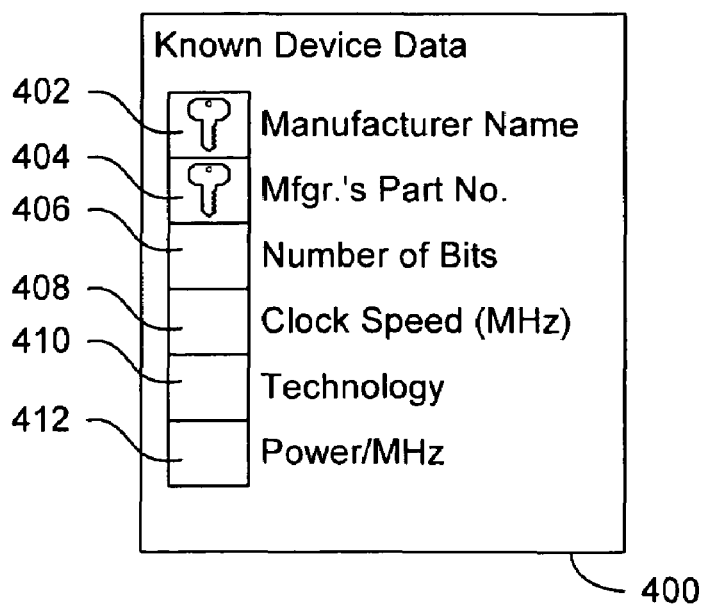
FIG. 4 is a diagram showing an example data structure for known device data.

FIG. 4 is a database table 400 illustrating one example of a data structure that is suitable for use for device database 218 of FIG. 2. The records of table 400 include a Manufacturer Name field 402, a Manufacturer's Part No. field 404, a Number of Bits field 406, a Clock Speed field 408, a Technology field 410, and a Power/MHz field 412. Manufacturer Name filed 402 includes data indicative of the manufacturer of the device associated with the record. Manufacturer's Part No. field 404 includes data indicative of a unique number used by the manufacturer to identify the device. Number of bits field 406 includes data indicative of the bit classification of the device. For example, is the device a 32-bit processor, a 64-bit processor, etc. Clock Speed field 408 includes data indicative of the clock speed(s) at which the device operates. Technology field 410 includes data indicative of the technology classification of the device. Finally, Power/MHz field 412 includes data indicative of power consumed by the device divided by the frequency at which the device operates.

The example fields shown in FIGS. 3-4 are shown by way of example and without limitation. Each of these fields includes data that can help identify an unknown device or demonstrate the presence of a known device. It should be understood however, that additional or alternative types of data could be used for these purposes without departing from the scope of the invention.

Figure 5:
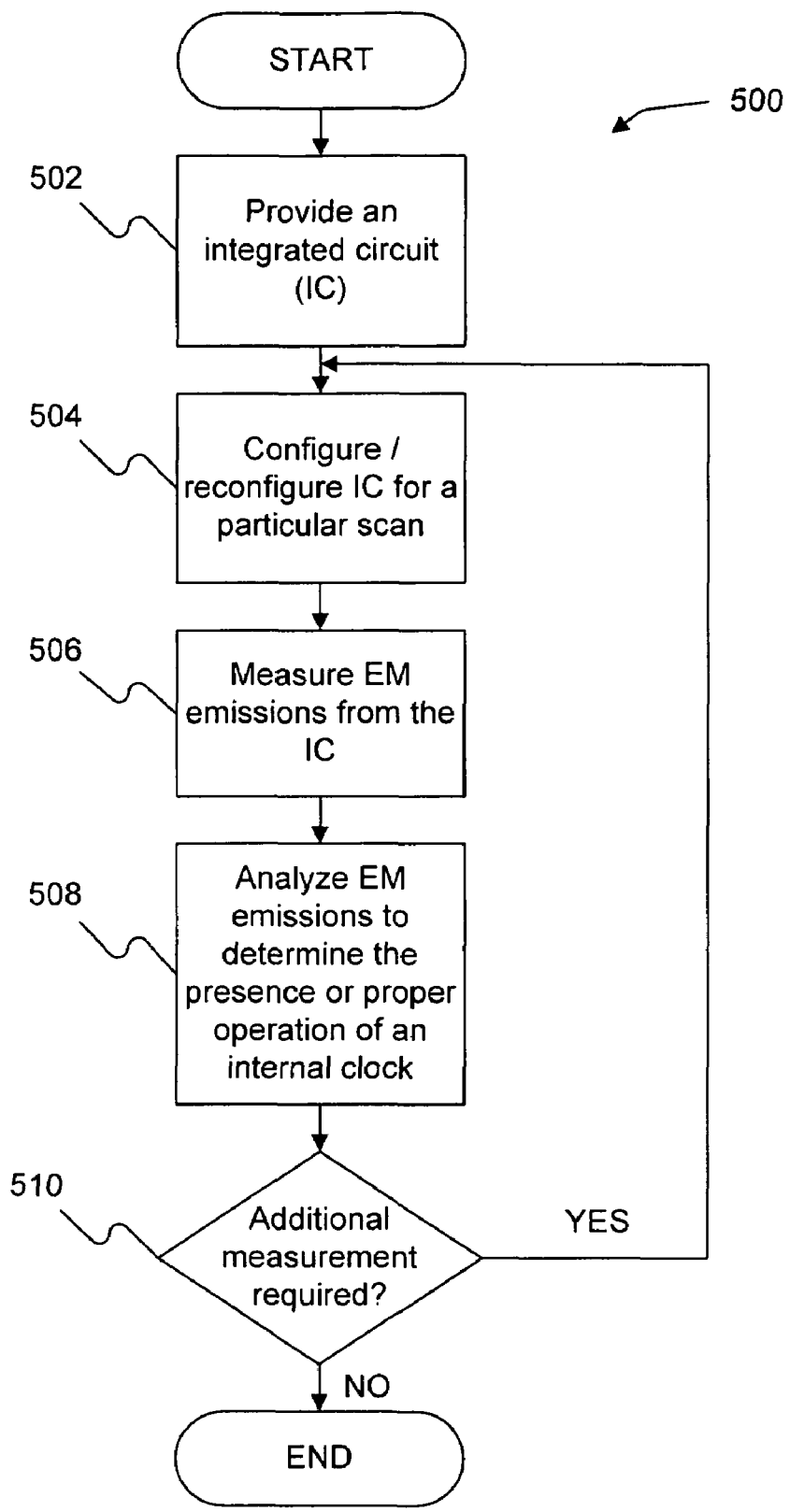
FIG. 5 is a flowchart summarizing one particular method for determining the internal operation of an integrated circuit (IC) via electromagnetic emissions from the IC.

FIG. 5 is a flowchart summarizing one example method 500 for testing an integrated circuit via electromagnetic emissions from the integrated circuit. In a first step 502, an integrated circuit is provided for testing. Then, in a second step 504, the integrated circuit is configured for a first EM emissions scan. Next, in a third step 506 EM emissions from the integrated circuit are measured. Then, in a fourth step 508, the measured EM emissions are analyzed to determine the presence and/or operability of an internal clock. Next, in a fifth step 510, it is determined whether additional measurements are required. If not, method 500 ends. Otherwise, method 500 returns to second step 504, where the integrated circuit is reconfigured for the next EM scan.

Figure 6:
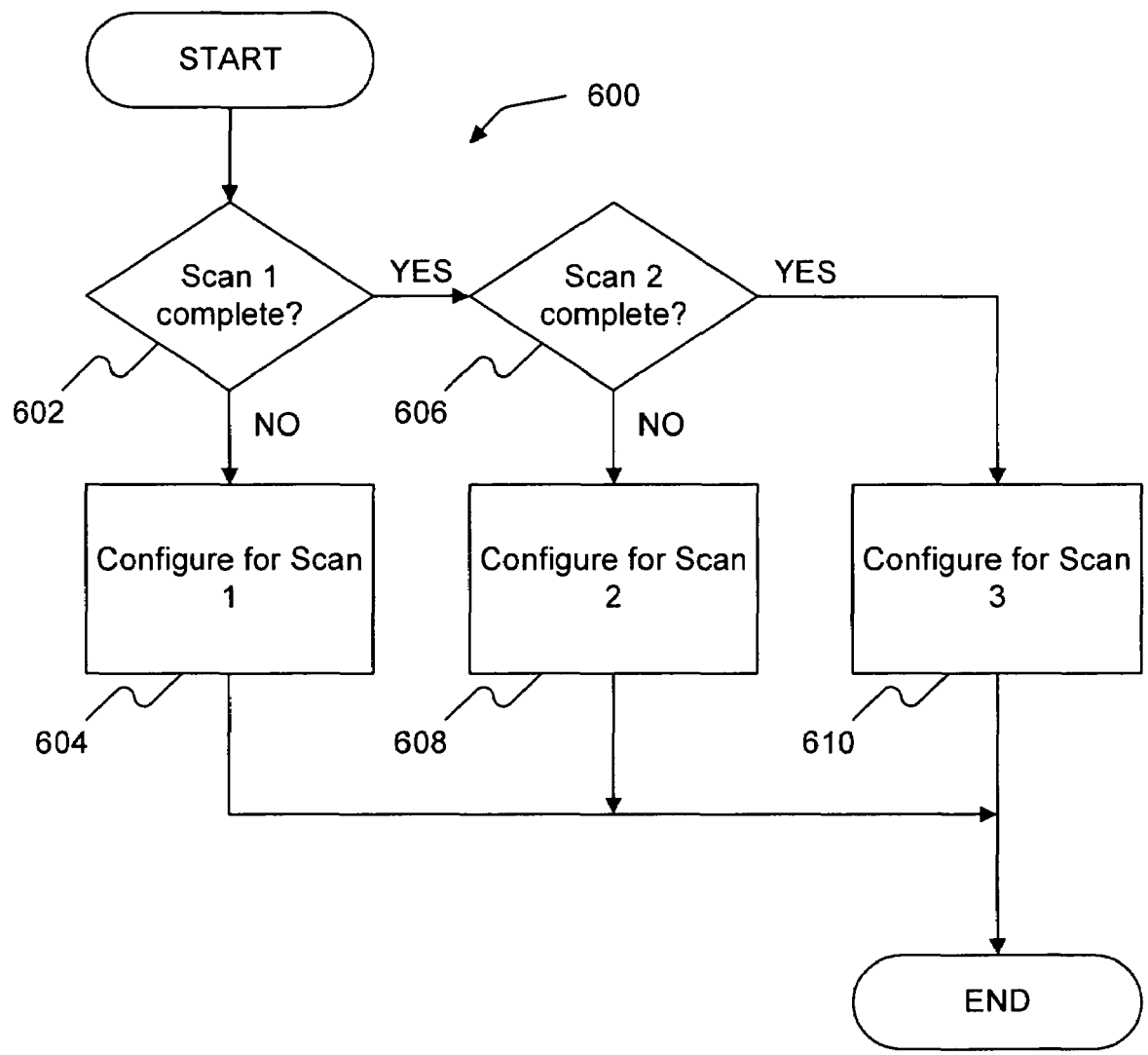
FIG. 6 is a flowchart summarizing one example method for configuring and reconfiguring an integrated circuit for an EM emissions scan.

FIG. 6 is a flowchart summarizing one example method 600 for performing second step 504 (configure/reconfigure IC) of method 500. In a first step 602 it is determined whether a first scan of the IC has been completed. If not, then in a second step 604 the IC is configured for the first scan (test mode 1), and method 600 ends. If the first scan has already been completed, then in a third step 606 it is determined whether a second scan of the IC has been completed. If not, then in a fourth step 608 the IC is configured for the second scan (test mode 2), and method 600 ends. If, however, it is determined that the second scan has already been completed, then in a fifth step 610 the IC is configured for a third scan, and method 600 ends.

Note that in the example method 600 there are three possible configurations of the IC, which are referred to as test modes 1-3. In test mode 1, the IC is provided with power and connected to any necessary external clock signals, such that the IC operates normally as it was intended to operate in its normal operating mode. In test mode 2, any external clock signals provided to the IC are disabled, but power is still provided to the IC. The IC operates, but without the benefit of the external clock signals. Finally, in test mode 3, the disabled external clock signals are reenabled. Important information regarding the operation of any internal clocks can be determined by analyzing the EM emissions from an IC in each of the three test modes, as will be explained in greater detail below.

Referring briefly back to FIG. 1, note that IC 102 can be placed in any of the three test modes by power and clock signal generator 110, under the control of computer 104. This would generally be the case when testing apparatus 100 is being used to perform quality control testing on known devices. However, when trying to determine the presence of internal clocks in an unknown device, perhaps an IC that is mounted on a printed circuit board with other devices, it may be necessary to configure the IC for testing manually. For example, it may be necessary to search for and physically interrupt any external clock signals being provided to the IC.

Figure 7:
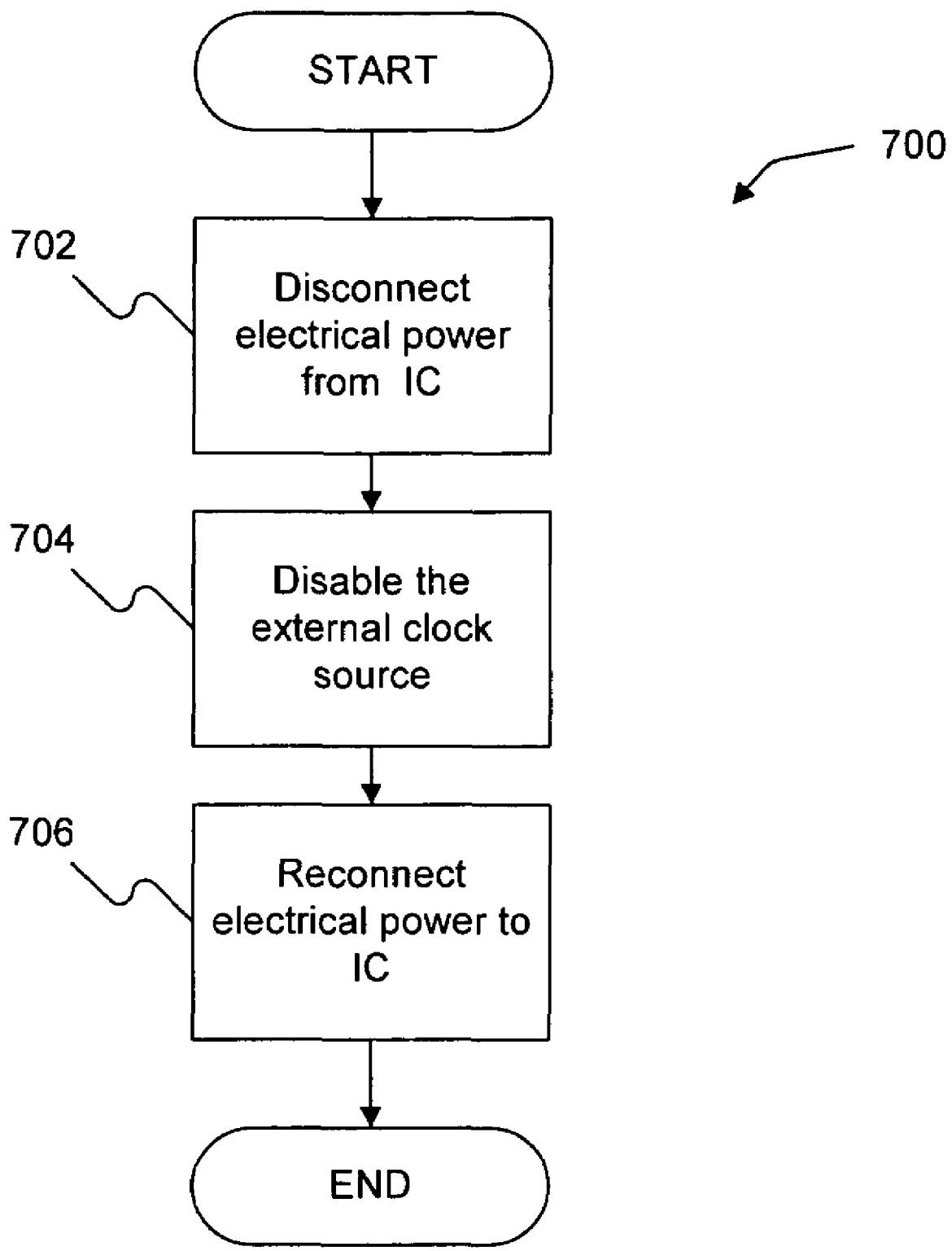
FIG. 7 is a flowchart summarizing one example method for configuring the integrated circuit for an EM emissions scan without an external clock source.

FIG. 7 is a flowchart summarizing one example method 700 for performing fourth step 608 (configure for scan 2) of method 600. In a first step 1102, electrical power is disconnected from the integrated circuit. Next, in a second step 1104, the external clock source (e.g., an oscillator, crystal, ceramics, clock circuit, etc.) is disabled by shorting or interrupting the connection to the integrated circuit. Then, in a third step 1106, power is reconnected to the integrated circuit, and method 700 ends.

Figure 8:
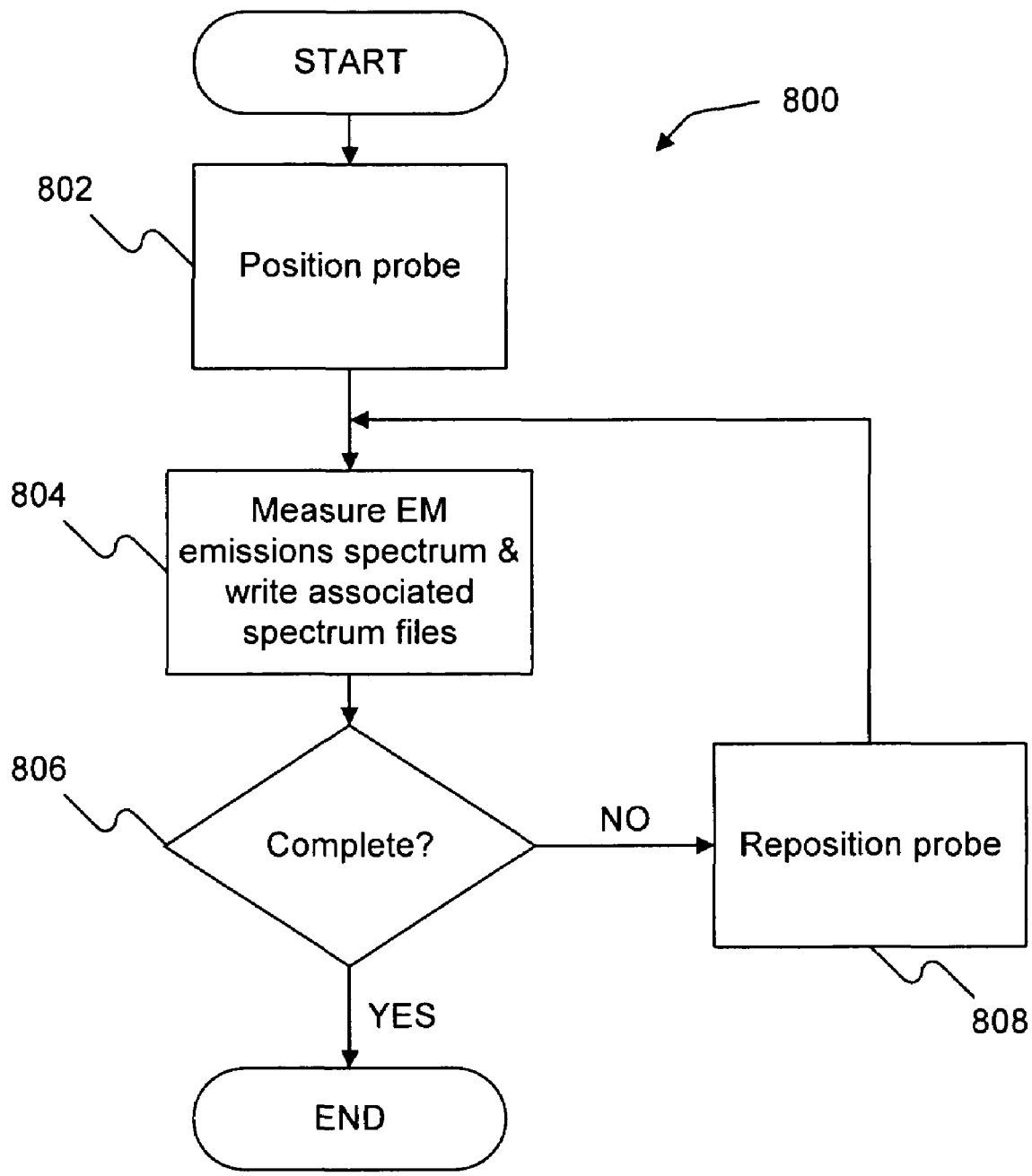
FIG. 8 is a flowchart summarizing one example method for measuring EM emissions from an integrated circuit.

FIG. 8 is a flowchart summarizing one example method 800 for performing third step 506 (measure EM emissions from IC) of method 500. In a first step 802, the electromagnetic sensing probe is positioned over the integrated circuit to be tested. As previously described herein, this may be accomplished via a robotic arm or by various other means such as manually holding the probe by hand. In a second step 804, the EM emissions spectrum is measured, and the data is stored in associated spectrum files. Then, in a third step 806 it is determined whether the measurements are complete. If so, method 800 ends. Otherwise, method 800 proceeds to a fourth step 708 where the electromagnetic sensing probe is repositioned. Then, method 800 returns to second step 804 where the EM emissions spectrum is again measured. Method 800 facilitates scanning different areas an IC to locate potential clock signals.

Figure 9:
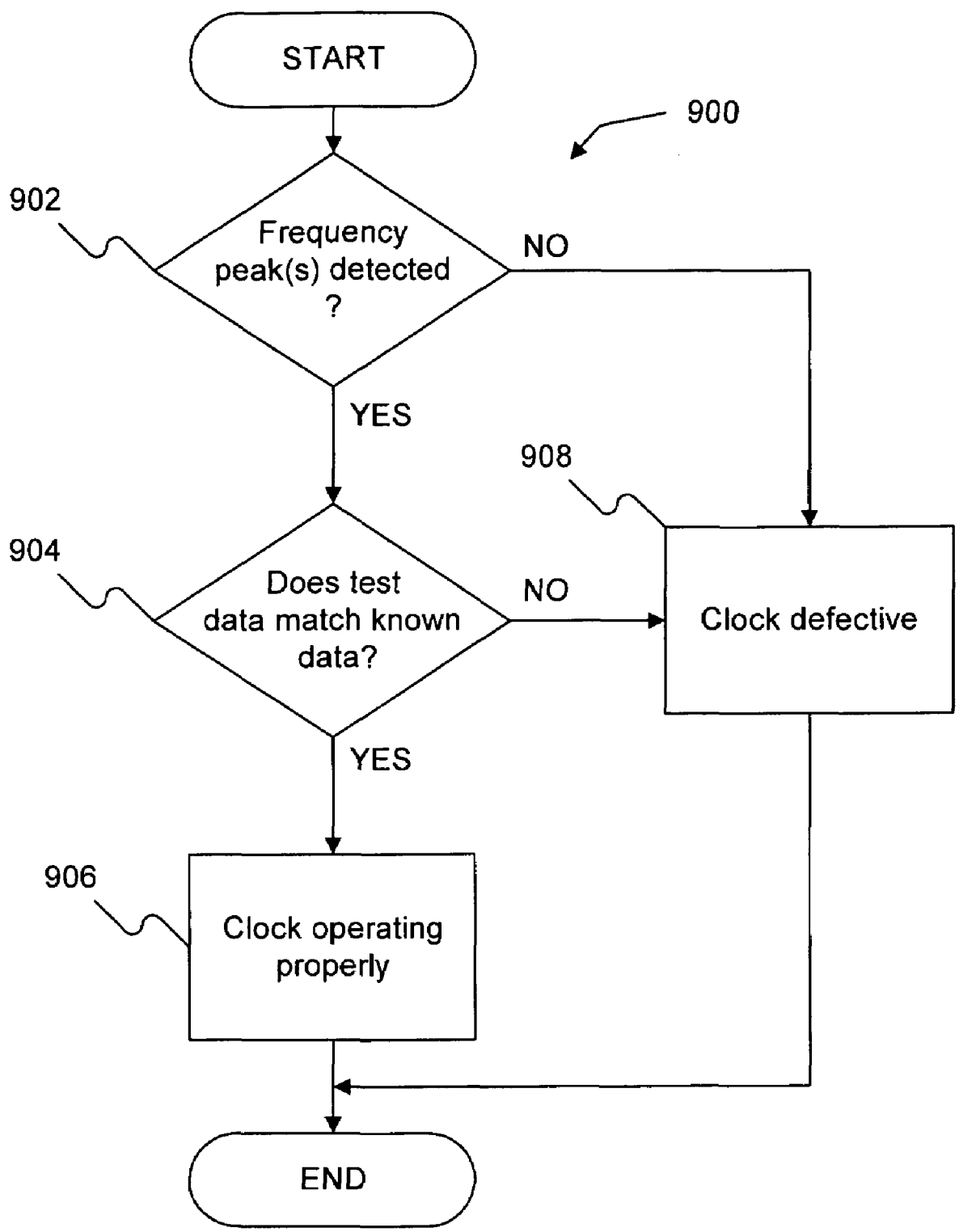
FIG. 9 is a flowchart summarizing one example method for analyzing EM emissions to determine the proper operation of an internal clock of a known integrated circuit.

FIG. 9 is a flowchart summarizing one example method 900 for performing fourth step 508 (analyze EM emissions) of method 500. Method 900 is useful to verify that internal clocks of an integrated circuit are operating correctly. In a first step 902, it is determined if any frequency peaks are detected in the EM emissions spectrum of the IC. If so, then in a second step 904 it is determined if the test data matches the known data for a properly operating device. If the test data does match the known data, then in a third step 906 it is concluded that the internal clock of the IC is operating properly, and method 900 ends. If, however, it is determined in first step 902 that no frequency peaks are detected, then method 900 proceeds to a fourth step 908 where it is concluded that the internal clocks of the IC are not operating properly, and method 900 ends. Similarly, if in second step 904 it is determined that the test data does not match the known data for the properly operating device, then method 900 proceeds to fourth step 908.

Figure 10:
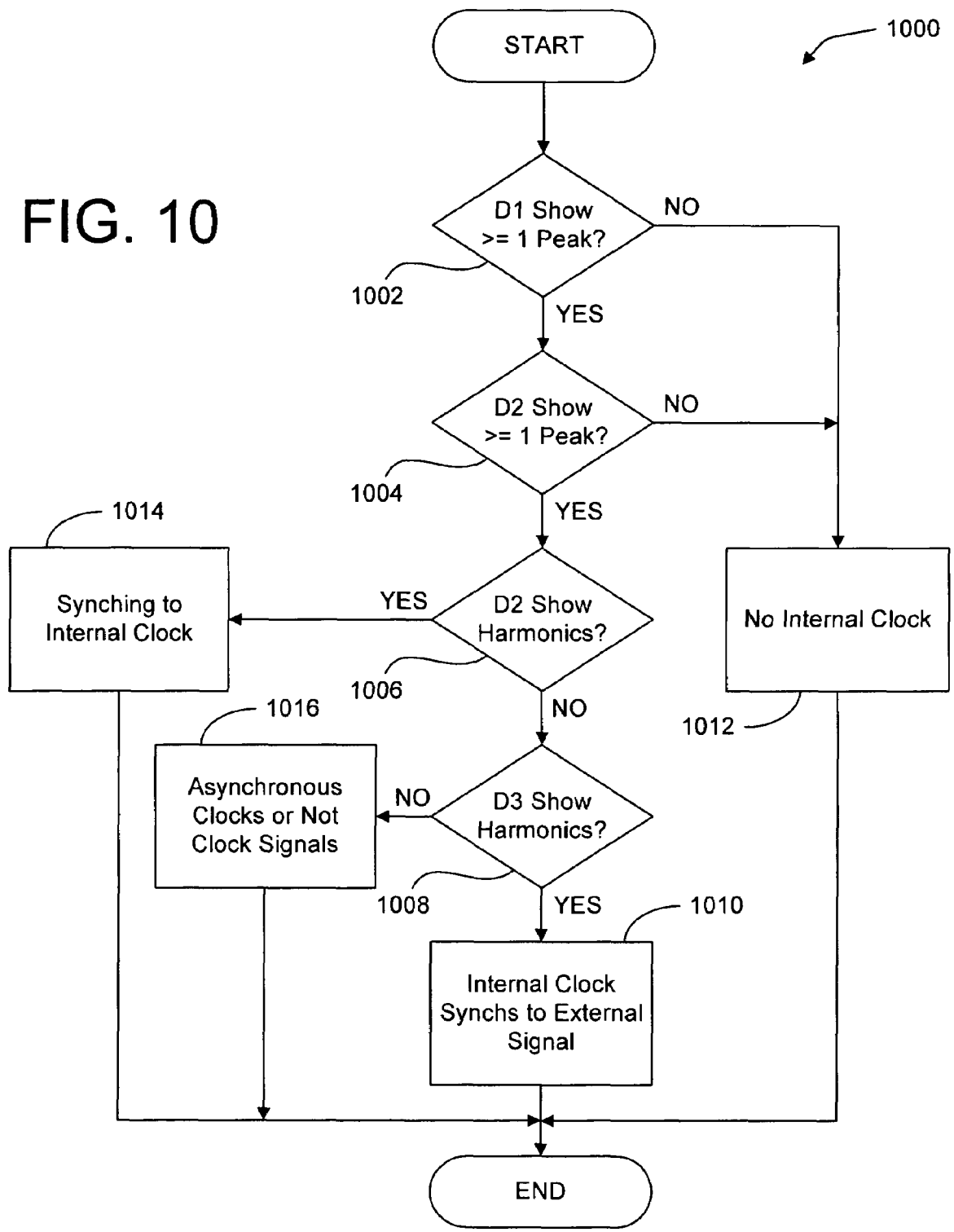
FIG. 10 is a flowchart summarizing one example method for analyzing EM emissions to determine the presence and character of an internal clock on an unknown integrated circuit.

FIG. 10 is a flowchart summarizing an example method 1000 of performing fourth step 508 (analyze EM emissions) of method 500. Method 1000 is useful in determining the presence and types of internal clocks in an unknown integrated circuit. In a first step 1002, the data D1 acquired in test mode 1 (normal operating mode) is analyzed to determine whether there is at least one frequency peak. If so, then in a second step 1004 the data D2 acquired in test mode 2 (external clock signal disabled) is analyzed to determine whether there is at least one frequency peak. If so, then in a third step 1006 the data D2 is analyzed to determine whether the existing frequency peaks are harmonics of a fundamental frequency peak. If not, then in a fourth step 1008 the data D3 acquired in test mode 3 (external clock signal reenabled) is analyzed to determine whether the existing frequency peaks are harmonics of a fundamental frequency peak. If so, then in a fifth step 1010 it is determined that there is an internal clock synching to the external clock signal, and method 1000 ends.

If, in first step 1002, it is determined that the D1 data does not show at least one frequency peak, then method 1000 proceeds to a sixth step 1012 where it is determined that there is no internal clock operating on the IC, and method 1000 ends. If, in third step 1006, it is determined that the D2 data shows that the existing frequency peaks are harmonics of a fundamental frequency peak, then method 1000 proceeds to a seventh step 1014 where it is determined that internal clocks on the IC are synching to an internal clock, and method 1000 ends. If, in fourth step 1008, it is determined that the D3 data does not show that the existing frequency peaks are harmonics of a fundamental frequency peak, then method 1000 proceeds to an eighth step 1016 where it is determined that the IC includes asynchronous clocks or the frequency peaks are not clock signals. Then, method 1000 ends.

Figure 11:
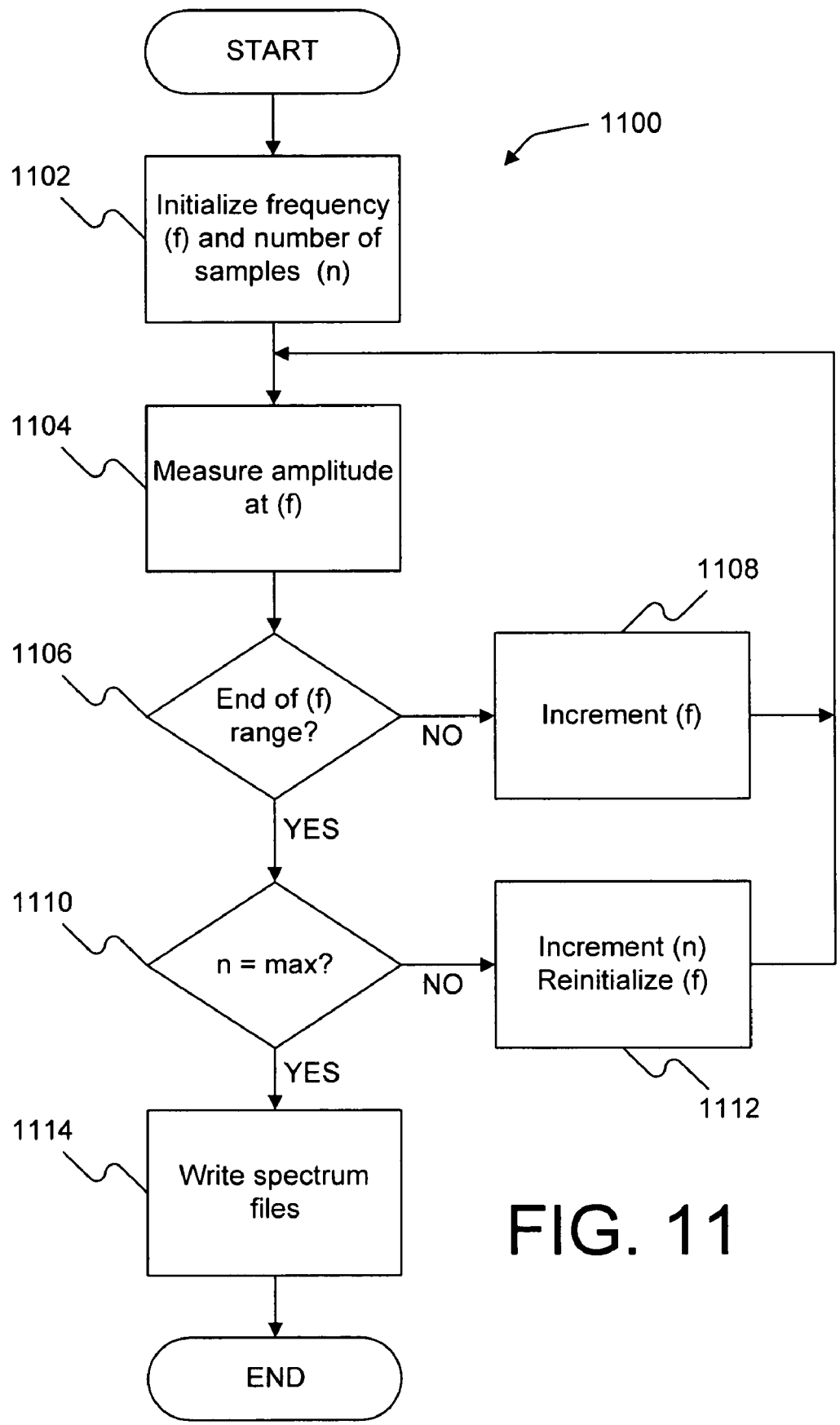
FIG. 11 is a flowchart summarizing one example method for measuring an EM emissions spectrum and writing the associated data to spectrum files.

FIG. 11 is a flowchart summarizing one example method 1100 for performing second step 804 (measuring EM emissions spectrum) of method 800. In a first step 1002, a frequency variable (f) and number of samples to be taken variable (n) are initialized. Then, in a second step 1004, the amplitude of the EM emissions from an integrated circuit are measured at the initial specified frequency (f). Next, in a third step 1006 it is determined if the current frequency being scanned is the last frequency in the frequency range. If not, then in a fourth step 1108, the frequency variable (f) is incremented and method 1100 returns to step 1004 to measure the amplitude of the next frequency. If, in third step 1106, it is determined that the last frequency in the range has been measured, then method 1100 proceeds to a fifth step 1110 where it is determined whether the required number of scans have been taken. If not, then method 1100 proceeds to a sixth step 1112, where the sample number variable (n) is incremented and the frequency variable (f) is reinitialized to facilitate the next scan. The loops of method 1100 are repeated until it is determined, in fifth step 1110, that the required number of scans have been completed. Then, in a seventh step 1014, spectrum files are written to store the measurement data taken.

Figure 12:
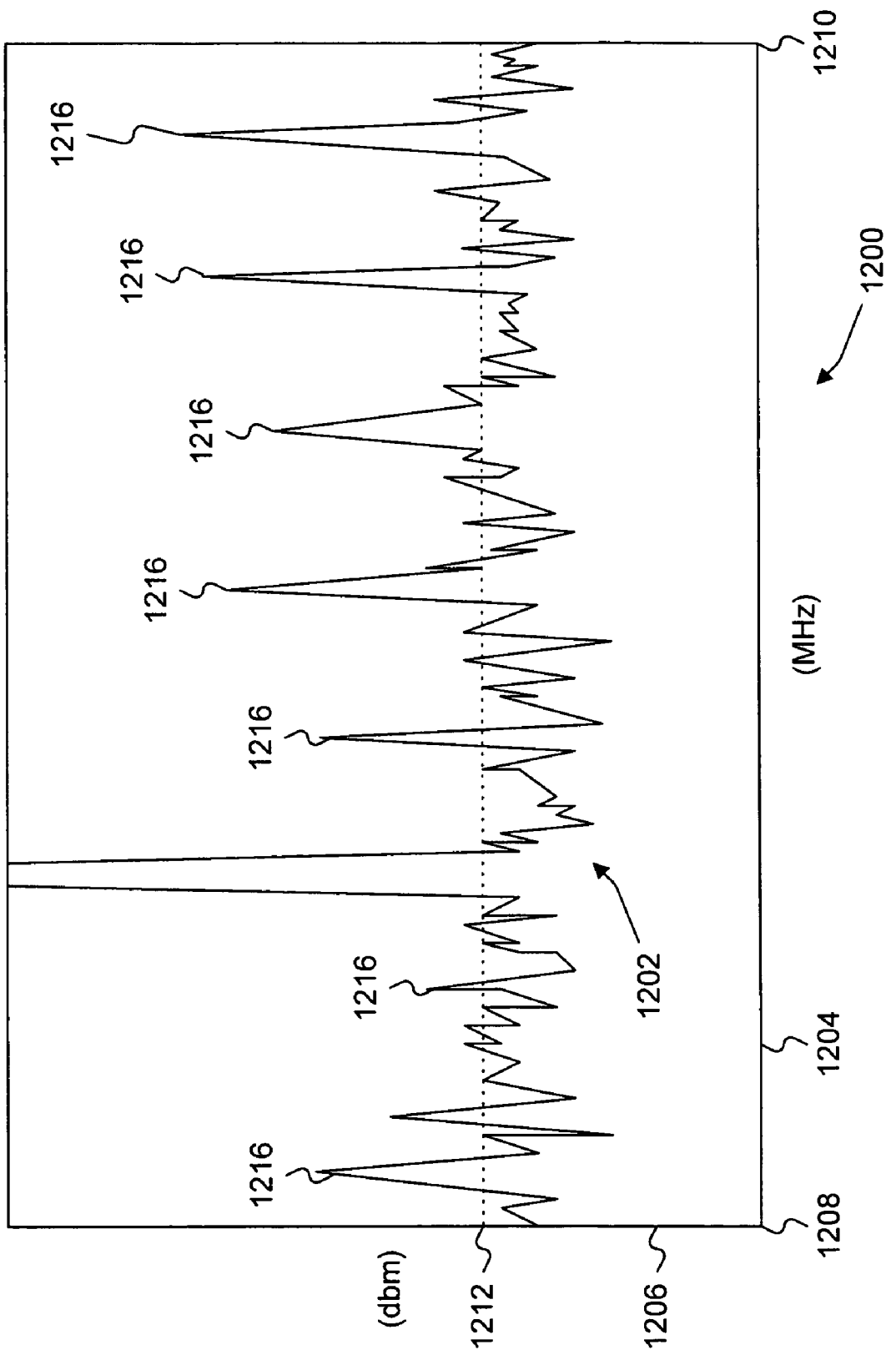
FIG. 12 illustrates an example spectrum analysis graph as displayed on the display of the computer of FIG. 1.

FIG. 12 shows a qualitative example of an EM spectrum graph 1200 of frequency (horizontal axis 1204) versus amplitude (vertical axis 1206), as can be displayed on display 122 of computer 104. Frequency axis 1204 includes a frequency sweep low value 1208 and a frequency sweep high value 1210 as limits within which a frequency sweep is performed. Graph 1200 shows several frequency peaks 1216 that rise above a noise floor 1222. These frequency peaks can be indicative of internal clocks operating at the frequencies at which the peaks occur.

FIG. 12 is shown to illustrate that information regarding the presence and/or proper operation of internal clocks can be gleaned from inspection of graph 1200 and the observance of changes in graph 1200 as the IC being tested is configured in test modes 1-3. For example, the approximately equal spacing of the peaks 1216 of graph 1200 indicates that one of peaks 1216 is a primary peak and the other equally spaced peaks are harmonics of the primary. This suggest a plurality of clocks operating at different frequencies, but synching to a primary clock signal.

When the IC is placed in test mode 2 (external clock signal disabled) the viewer can determine whether the internal clocks are synching with an internal clock or the external clock signal. If the internal clocks are synching with an internal clock, then graph 1200 should remain unchanged when the external clock signal is removed. However, if the peaks wander (i.e., the frequencies become unstable), that suggests that the internal clocks are attempting to synch to the external clock signal that has been disabled. If the frequency peaks stabilize when the IC is placed in test mode 3 (external clock signal is reenabled), then the internal clocks are synching to the external clock signal. This is essentially the same analysis performed by method 1000 of FIG. 10, and can be accomplished directly by observing graph 1200 as the IC is placed in the various test modes.

The description of particular embodiments of the present invention is now complete. Many of the described features may be substituted, altered or omitted without departing from the scope of the invention. For example, alternate means for recording EM spectrum data (e.g., manual data taking, alternate data structures, etc.) may be substituted for the computerize method and apparatus shown. As another example, although the invention is shown as implemented with software on a general purpose compute, it should be understood that the invention can be implemented in hardware, firmware, software, or any combination thereof. Indeed, as described with reference to FIG. 12, the invention can be implemented manually with a spectrum analyzer and an EM sensing probe. These and other deviations from the particular embodiments shown will be apparent to those skilled in the art, particularly in view of the foregoing disclosure.

I claim:

1. A method for determining the internal operation of an integrated circuit comprising:
    measuring electromagnet emissions from said integrated circuit; and
    analyzing said electromagnetic emissions; and wherein
    said step of measuring electromagnetic emissions includes measuring the amplitude of said electromagnetic emissions over a range of frequencies; and
    said step of analyzing said electromagnetic emissions includes identifying frequencies corresponding to amplitudes greater than a predetermined amplitude.

2. A method according to claim 1, wherein said step of measuring electromagnetic emissions from said integrated circuit includes using an RF probe.

3. A method A method according to claim 2, wherein said step of measuring electromagnetic emissions from said integrated circuit includes using an RF close end probe.

4. A method according to claim 1, further comprising configuring said integrated circuit prior to said step of measuring said electromagnetic emissions.

5. A method according to claim 4, wherein said step of configuring said integrated circuit includes placing said integrated circuit in its normal operating mode.

6. A method according to claim 5, wherein said step of placing said integrated circuit chip in its normal operating mode includes providing power and any external clock signal to said integrated circuit.

7. A method according to claim 4, wherein said step of configuring said integrated circuit includes:
    providing power to said integrated circuit; and
    disabling any external clock signal to said integrated circuit.

8. A method according to claim 7, wherein said step of disabling any external clock signal to said integrated circuit includes:
    disconnecting power to said integrated circuit;
    disabling any external clock signal to said integrated circuit; and
    reconnecting power to said integrated circuit.

9. A method according to claim 4, wherein said step of configuring said integrated circuit includes reenabling a disabled external clock signal to said integrated circuit while power is supplied to said integrated circuit.

10. A method according to claim 4, wherein said step of configuring said integrated circuit includes re-enabling a disabled external clock signal to said integrated circuit while power is supplied to said integrated circuit.

11. A method according to claim 1, further comprising:
    configuring said integrated circuit prior to said step of measuring said electromagnetic emissions;
    reconfiguring said integrated circuit differently after said step of measuring said electromagnetic emissions; and
    remeasuring said electromagnetic emissions from said integrated circuit after said step of reconfiguring said integrated circuit.

12. A method according to claim 1, further comprising:
    configuring said integrated circuit by supplying power and any external clock signal to said integrated circuit prior to measuring said electromagnetic emissions;
    reconfiguring said integrated circuit alter said step of measuring said electromagnetic emissions by disconnecting power to said integrated circuit, disabling any external clock signal to said integrated circuit, and reconnecting power to said integrated circuit; and remeasuring said electromagnetic emissions from said integrated circuit after reconfiguring said integrated circuit.

13. A method according to claim 12, further comprising:

reconnecting any external clock signal to said integrated circuit following said step of remeasuring said electromagnetic emissions; and remeasuring said electromagnetic emissions from said integrated circuit a second time after said step of reconnecting any external clock signal.

14. A method according to claim 1, wherein said step of analyzing said electromagnetic emissions includes determining whether said electromagnetic emissions are below a predetermined RFI level.

15. A method according to claim 1, wherein said step of analyzing said electromagnetic emissions includes comparing said identified frequencies to a predetermined set of frequencies to determine whether one or more clocks of said integrated circuit are operating properly.

16. A method according to claim 1, wherein said step of analyzing said electromagnetic emissions includes comparing said identified frequencies to sets of frequencies associated with known devices to determine whether any of said known devices are embedded in said integrated circuit.

17. A method according to claim 1, further comprising:

disabling any external clock signal to said integrated circuit after said step of measuring said electromagnetic emissions from said integrated circuit; and remeasuring said electromagnetic emissions from said integrated circuit while said external clock signal is disabled;

identifying frequencies corresponding to amplitudes greater than said predetermined amplitude in said remeasured electromagnetic emissions; and comparing said identified frequencies of said measured electromagnetic emissions with said identified frequencies of said remeasured electromagnetic emissions.

18. A method according to claim 1, wherein said step of measuring said electromagnetic emissions includes measuring said electromagnetic emissions at several different locations with respect to said integrated circuit.

19. An electronically readable medium having code embodied therein for causing an electronic device to perform the method of claim 1.

20. A method according to claim 1, wherein said step of measuring said electromagnetic emissions includes measuring said electromagnetic emissions at several different locations with respect to said integrated circuit.

21. An apparatus for determining the internal operation of an integrated circuit, comprising:

a probe for sensing electromagnetic radiation from said integrated circuit;

a spectrum capture device operative to convert said electromagnetic radiation sensed by said probe into electronic data; and a spectrum analyzer operative to process said electronic data to provide information about the internal operation of said integrated circuit; and wherein said spectrum analyzer is operative to compare said electronic data with sets of electronic data associated with known electronic devices to determine whether one or more of said known electronic devices are embedded in said integrated circuit.

22. An apparatus according to claim 21, further comprising a display for presenting said data from said spectrum analyzer.

23. An apparatus according to claim 22, wherein said spectrum analyzer is operative to present said data on said display in the form of an amplitude versus frequency graph.

24. An apparatus according to claim 21, wherein said spectrum capture device includes a spectrum capture routine and said spectrum analyzer includes a spectrum analyzer routine; and said apparatus further comprising:

a processing unit for executing code and processing data; and memory for storing said code, said code including said spectrum capture routine and said spectrum analyzer routine.

25. An apparatus according to claim 24, wherein said spectrum capture device is further operative to control the position of said probe.

26. An apparatus according to claim 21, wherein said spectrum capture device is further operative to selectively interrupt electrical power to said integrated circuit.

27. An apparatus according to claim 21, wherein said spectrum capture device is further operative to selectively enable and disable an external clock signal to said integrated circuit.

28. An apparatus according to claim 21, wherein said spectrum capture device is operative to store said electronic data as records indicative of an electromagnetic spectrum emitted by said integrated circuit.

29. An apparatus according to claim 21, wherein:

said spectrum capture device is operative to capture a first set of spectrum data from said integrated circuit and a second set of spectrum data from said integrated circuit; and said spectrum analyzer is operative to compare said first set of spectrum data to said second set of spectrum data to identify at least one predetermined difference.

30. An apparatus according to claim 29, wherein said spectrum capture device is operative to selectively disable an external clock signal to said integrated circuit during the capture of one of said first set of spectrum data and said second set of spectrum data.

31. An apparatus according to claim 21, wherein said spectrum analyzer is operative to compare said electronic data to electronic data indicative of an internal clock of said integrated circuit operating properly.

32. A method for determining the internal operation of an integrated circuit comprising:

measuring electromagnet emissions from said integrated circuit;

configuring said integrated circuit prior to said step of measuring said electromagnetic emissions;

reconfiguring said integrated circuit differently after said step of measuring said electromagnetic emissions;

remeasuring said electromagnetic emissions from said integrated circuit after said step of reconfiguring said integrated circuit; and analyzing said electromagnetic emissions.

33. A method according to claim 32, wherein said step of measuring electromagnetic emissions from said integrated circuit includes using an RF probe.

34. A method A method according to claim 33, wherein said step of measuring electromagnetic emissions from said integrated circuit includes using an RF close end probe.

35. A method according to claim 32, wherein said step of configuring said integrated circuit includes placing said integrated circuit in its normal operating mode.

36. A method according to claim 35, wherein said step of placing said integrated circuit chip in its normal operating mode includes providing power and any external clock signal to said integrated circuit.

37. A method according to claim 32, wherein said step of configuring said integrated circuit includes:
providing power to said integrated circuit; and
disabling any external clock signal to said integrated circuit.

38. A method according to claim 37, wherein said step of disabling any external clock signal to said integrated circuit includes:
disconnecting power to said integrated circuit;
disabling any external clock signal to said integrated circuit; and
reconnecting power to said integrated circuit.

39. A method according to claim 32, wherein said step of configuring said integrated circuit includes re-enabling a disabled external clock signal to said integrated circuit while power is supplied to said integrated circuit.

40. A method according to claim 32, wherein:
said step of configuring said integrated circuit includes supplying power and any external clock signal to said integrated circuit prior to measuring said electromagnetic emissions; and
said step of reconfiguring said integrated circuit after said step of measuring said electromagnetic emissions includes disconnecting power to said integrated circuit, disabling any external clock signal to said integrated circuit, and reconnecting power to said integrated circuit.

41. A method according to claim 40, further comprising:
reconnecting any external clock signal to said integrated circuit following said step of remeasuring said electromagnetic emissions; and
remeasuring said electromagnetic emissions from said integrated circuit a second time after said step of reconnecting any external clock signal.

42. A method according to claim 32, wherein said step of analyzing said electromagnetic emissions includes determining whether said electromagnetic emissions are below a predetermined RFI level.

43. A method according to claim 32, wherein:
said step of measuring electromagnetic emissions includes measuring the amplitude of said electromagnetic emissions over a range of frequencies; and
said step of analyzing said electromagnetic emissions includes
identifying frequencies corresponding to amplitudes greater than a predetermined amplitude, and
comparing said identified frequencies to a predetermined set of frequencies to determine whether one or more clocks of said integrated circuit are operating properly.

44. A method according to claim 32, wherein:
said step of measuring electromagnetic emissions includes measuring the amplitude of said electromagnetic emissions over a range of frequencies; and
said step of analyzing said electromagnetic emissions includes
identifying frequencies corresponding to amplitudes greater than a predetermined amplitude, and
comparing said identified frequencies to sets of frequencies associated with known devices to determine whether any of said known devices are embedded in said integrated circuit.

45. A method according to claim 32, wherein said step of measuring electromagnetic emissions includes measuring the amplitude of said electromagnetic emissions over a range of frequencies, and said step of analyzing said electromagnetic emissions includes identifying frequencies corresponding to amplitudes greater than a predetermined amplitude, said method further comprising:
disabling any external clock signal to said integrated circuit after said step of measuring said electromagnetic emissions from said integrated circuit;
remeasuring said electromagnetic emissions from said integrated circuit while said external clock signal is disabled;
identifying frequencies corresponding to amplitudes greater than said predetermined amplitude in said remeasured electromagnetic emissions; and
comparing said identified frequencies of said measured electromagnetic emissions with said identified frequencies of said remeasured electromagnetic emissions.

46. An electronically readable medium having code embodied therein for causing an electronic device to perform the method of claim 32.

47. A method for determining the internal operation of an integrated circuit comprising:
measuring electromagnet emissions from said integrated circuit;
configuring said integrated circuit prior to said step of measuring said electromagnetic emissions; and
analyzing said electromagnetic emissions; and
wherein said step of configuring said integrated circuit includes
providing power to said integrated circuit, and
disabling any external clock signal to said integrated circuit.

48. A meted according to claim 47, wherein said step of measuring electromagnetic emissions from said integrated circuit includes using an RF probe.

49. A method A method according to claim 48, wherein said step of measuring electromagnetic emissions from said integrated circuit includes using an RF close end probe.

50. A method according to claim 47, wherein said step of configuring said integrated circuit includes placing said integrated circuit in its normal operating mode.

51. A method according to claim 47, wherein said step of disabling any external clock signal to said integrated circuit includes:
disconnecting power to said integrated circuit;
disabling any external clock signal to said integrated circuit; and
reconnecting power to said integrated circuit.

52. A method according to claim 47, wherein said step of analyzing said electromagnetic emissions includes determining whether said electromagnetic emissions are below a predetermined RFI level.

53. A method according to claim 47, wherein:
said step of measuring electromagnetic emissions includes measuring the amplitude of said electromagnetic emissions over a range of frequencies; and
said step of analyzing said electromagnetic emissions includes
identifying frequencies corresponding to amplitudes greater than a predetermined amplitude, and
comparing said identified frequencies to a predetermined set of frequencies to determine whether one or more clocks of said integrated circuit are operating properly.

54. A method according to claim 47, wherein:
said step of measuring electromagnetic emissions includes measuring the amplitude of said electromagnetic emissions over a range of frequencies; and
said step of analyzing said electromagnetic emissions includes
identifying frequencies corresponding to amplitudes greater than a predetermined amplitude, and
comparing said identified frequencies to sets of frequencies associated with known devices to determine whether any of said known devices are embedded in said integrated circuit.

55. A method according to claim 47, wherein said step of measuring said electromagnetic emissions includes measuring said electromagnetic emissions at several different locations with respect to said integrated circuit.

56. An electronically readable medium having code embodied therein for causing an electronic device to perform the method of claim 47.

57. A method for determining the internal operation of an integrated circuit comprising:
measuring electromagnet emissions from said integrated circuit;
configuring said integrated circuit prior to said step of measuring said electromagnetic emissions; and
analyzing said electromagnetic emissions; and
wherein said step of configuring said integrated circuit includes re-enabling a disabled external clock signal to said integrated circuit while power is supplied to said integrated circuit.

58. A method according to claim 57, wherein said step of measuring electromagnetic emissions from said integrated circuit includes using an RF probe.

59. A method A method according to claim 58, wherein said step of measuring electromagnetic emissions from said integrated circuit includes using an RF close end probe.

60. A method according to claim 57, wherein said step of configuring said integrated circuit includes placing said integrated circuit in its normal operating mode.

61. A method according to claim 60, wherein said step of placing said integrated circuit chip in its normal operating mode includes providing power and any external clock signal to said integrated circuit.

62. A method according to claim 57, wherein said step of configuring said integrated circuit includes:
providing power to said integrated circuit; and
disabling any external clock signal to said integrated circuit prior to re-enabling said external clock signal.

63. A method according to claim 62, wherein said step of disabling any external clock signal to said integrated circuit includes:
disconnecting power to said integrated circuit;
disabling any external clock signal to said integrated circuit; and
reconnecting power to said integrated circuit.

64. A method according to claim 57, further comprising:
reconfiguring said integrated circuit after said step of measuring said electromagnetic emissions by disconnecting power to said integrated circuit, disabling any external clock signal to said integrated circuit, and reconnecting power to said integrated circuit; and
remeasuring said electromagnetic emissions from said integrated circuit after reconfiguring said integrated circuit.

65. A method according to claim 64, further comprising:
reconnecting any external clock signal to said integrated circuit following said step of remeasuring said electromagnetic emissions; and
remeasuring said electromagnetic emissions from said integrated circuit a second time after said step of reconnecting any external clock signal.

66. A method according to claim 57, wherein said step of analyzing said electromagnetic emissions includes determining whether said electromagnetic emissions are below a predetermined RFI level.

67. A method according to claim 57, wherein:
said step of measuring electromagnetic emissions includes measuring the amplitude of said electromagnetic emissions over a range of frequencies; and
said step of analyzing said electromagnetic emissions includes identifying frequencies corresponding to amplitudes greater than a predetermined amplitude.

68. A method according to claim 67, wherein said step of analyzing said electromagnetic emissions includes comparing said identified frequencies to a predetermined set of frequencies to determine whether one or more clocks of said integrated circuit are operating properly.

69. A method according to claim 67, wherein said step of analyzing said electromagnetic emissions includes comparing said identified frequencies to sets of frequencies associated with known devices to determine whether any of said known devices are embedded in said integrated circuit.

70. A method according to claim 67, further comprising:
disabling any external clock signal to said integrated circuit alter said step of measuring said electromagnetic emissions from said integrated circuit;
remeasuring said electromagnetic emissions from said integrated circuit while said external clock signal is disabled;
identifying frequencies corresponding to amplitudes greater than said predetermined amplitude in said remeasured electromagnetic emissions; and
comparing said identified frequencies of said measured electromagnetic emissions with said identified frequencies of said remeasured electromagnetic emissions.

71. A method according to claim 57, wherein said step of measuring said electromagnetic emissions includes measuring said electromagnetic emissions at several different locations with respect to said integrated circuit.

72. An electronically readable medium having code embodied therein for causing an electronic device to perform the method of claim 57.

73. A method for determining the internal operation of an integrated circuit comprising:
measuring electromagnet emissions from said integrated circuit; and
configuring said integrated circuit by supplying power and any external clock signal to said integrated circuit prior to measuring said electromagnetic emissions;
reconfiguring said integrated circuit after said step of measuring said electromagnetic emissions by disconnecting power to said integrated circuit, disabling any external clock signal to said integrated circuit, and reconnecting power to said integrated circuit;
remeasuring said electromagnetic emissions from said integrated circuit after reconfiguring said integrated circuit; and
analyzing said electromagnetic emissions.

74. A method according to claim 73, wherein said step of measuring electromagnetic emissions from said integrated circuit includes using an RF probe.

75. A method A method according to claim 74, wherein said step of measuring electromagnetic emissions from said integrated circuit includes using an RF close end probe.

76. A method according to claim 73, wherein said step of configuring said integrated circuit includes placing said integrated circuit in its normal operating mode.

77. A method according to claim 73, wherein said step of configuring said integrated circuit includes re-enabling a disabled external clock signal to said integrated circuit while power is supplied to said integrated circuit.

78. A method according to claim 73, further comprising:
reconnecting any external clock signal to said integrated circuit following said step of remeasuring said electromagnetic emissions; and
remeasuring said electromagnetic emissions from said integrated circuit a second time after said step of reconnecting any external clock signal.

79. A meted according to claim 73, wherein said step of analyzing said electromagnetic emissions includes determining whether said electromagnetic emissions are below a predetermined RFI level.

80. A method according to claim 73, wherein:
said step of measuring electromagnetic emissions includes measuring the amplitude of said electromagnetic emissions over a range of frequencies; and
said step of analyzing said electromagnetic emissions includes
identifying frequencies corresponding to amplitudes greater than a predetermined amplitude, and
comparing said identified frequencies to a predetermined set of frequencies to determine whether one or more clocks of said integrated circuit are operating properly.

81. A method according to claim 73, wherein:
said step of measuring electromagnetic emissions includes measuring the amplitude of said electromagnetic emissions over a range of frequencies; and
said step of analyzing said electromagnetic emissions includes
identifying frequencies corresponding to amplitudes greater than a predetermined amplitude, and
comparing said identified frequencies to sets of frequencies associated with known devices to determine whether any of said known devices are embedded in said integrated circuit.

82. A method according to claim 73, wherein said step of measuring electromagnetic emissions includes measuring the amplitude of said electromagnetic emissions over a range of frequencies, and said step of analyzing said electromagnetic emissions includes identifying frequencies corresponding to amplitudes greater than a predetermined amplitude, said method further comprising:
identifying frequencies corresponding to amplitudes greater than said predetermined amplitude in said remeasured electromagnetic emissions; and
comparing said identified frequencies of said measured electromagnetic emissions with said identified frequencies of said remeasured electromagnetic emissions.

83. A method according to claim 73, wherein said step of measuring said electromagnetic emissions includes measuring said electromagnetic emissions at several different locations with respect to said integrated circuit.

84. An electronically readable medium having code embodied therein for causing an electronic device to perform the method of claim 73.

85. An apparatus for determining the internal operation of an integrated circuit, comprising:
a probe for sensing electromagnetic radiation from said integrated circuit; and
a spectrum capture device operative to convert said electromagnetic radiation sensed by said probe into electronic data; and
a spectrum analyzer operative to process said electronic data to provide information about the internal operation of said integrated circuit; and wherein
said spectrum capture device is operative to capture a first set of spectrum data from said integrated circuit and a second set of spectrum data from said integrated circuit;
said spectrum analyzer is operative to compare said first set of spectrum data to said second set of spectrum data to identify at least one predetermined difference; and
said spectrum capture device is operative to selectively disable an external clock signal to said integrated circuit during the capture of one of said first set of spectrum data and said second set of spectrum data.

86. An apparatus according to claim 85, further comprising a display for presenting said data from said spectrum analyzer.

87. An apparatus according to claim 86, wherein said spectrum analyzer is operative to present said data on said display in the form of an amplitude versus frequency graph.

88. An apparatus according to claim 85, wherein said spectrum capture device includes a spectrum capture routine and said spectrum analyzer includes a spectrum analyzer routine; and said apparatus further comprising:
a processing unit for executing code and processing data; and
memory for storing said code, said code including said spectrum capture routine and said spectrum analyzer routine.

89. An apparatus according to claim 88, wherein said spectrum capture device is further operative to control the position of said probe.

90. An apparatus according to claim 85, wherein said spectrum capture device is further operative to selectively interrupt electrical power to said integrated circuit.

91. An apparatus according to claim 85, wherein said spectrum capture device is further operative to selectively enable and disable an external clock signal to said integrated circuit.

92. An apparatus according to claim 85, wherein said spectrum capture device is operative to store said electronic data as records indicative of an electromagnetic spectrum emitted by said integrated circuit.

93. An apparatus according to claim 21, wherein said spectrum analyzer is operative to compare said electronic data to electronic data indicative of an internal clock of said integrated circuit operating properly.

* * * * *